(12) United States Patent
Onishi et al.

(10) Patent No.: US 11,337,351 B2
(45) Date of Patent: May 17, 2022

(54) MOUNTING ACCURACY MEASUREMENT SYSTEM FOR COMPONENT MOUNTING LINE, AND MOUNTING ACCURACY MEASUREMENT METHOD

(71) Applicant: FUJI CORPORATION, Chiryu (JP)

(72) Inventors: Michinaga Onishi, Chiryu (JP); Jun Iisaka, Nisshin (JP); Shigeto Oyama, Kariya (JP)

(73) Assignee: FUJI CORPORATION, Chiryu (JP)

( * ) Notice: Subject to any disclaimer, the term of this patent is extended or adjusted under 35 U.S.C. 154(b) by 1 day.

(21) Appl. No.: 16/645,629

(22) PCT Filed: Sep. 26, 2017

(86) PCT No.: PCT/JP2017/034722
§ 371 (c)(1),
(2) Date: Mar. 9, 2020

(87) PCT Pub. No.: WO2019/064338
PCT Pub. Date: Apr. 4, 2019

(65) Prior Publication Data
US 2020/0281105 A1 Sep. 3, 2020

(51) Int. Cl.
*B23P 19/00* (2006.01)
*H05K 13/08* (2006.01)
*H05K 13/04* (2006.01)

(52) U.S. Cl.
CPC ....... *H05K 13/0812* (2018.08); *H05K 13/041* (2018.08); *H05K 13/0409* (2018.08);
(Continued)

(58) Field of Classification Search
CPC .... H05K 13/089; H05K 13/08; H05K 13/083; Y10T 29/49133; Y10T 29/4978; Y10T 29/4913; Y10T 29/53174
(Continued)

(56) References Cited

U.S. PATENT DOCUMENTS 8,447,566 B2* 5/2013 Maenishi ............. H05K 13/085
702/182
8,849,442 B2* 9/2014 Ishimoto ................ H05K 13/08
700/121
2013/0055911 A1 3/2013 Mizuno et al.

FOREIGN PATENT DOCUMENTS

CN 102438435 A 5/2012
EP 3 154 882 4/2017
(Continued)

OTHER PUBLICATIONS

International Search Report dated Jan. 9, 2018 in PCT/JP2017/034722 filed Sep. 26, 2017, 2 pages.

*Primary Examiner* — Thiem D Phan
(74) *Attorney, Agent, or Firm* — Oblon, McClelland, Maier & Neustadt, L.L.P.

(57) ABSTRACT

Each of multiple component mounting machines constituting a component mounting line is configured to switch between a production mode in which a component is mounted on a circuit board that has been conveyed in and then conveyed out, a mounting accuracy measurement mode in which a mounting accuracy measurement component is mounted at a predetermined position on a mounting accuracy measurement board and the mounting accuracy is measured, and a pass mode in which a component is conveyed out without being mounted on the board conveyed in. When the control mode of two or more component mounters among the multiple component mounting machines is the mounting accuracy measurement mode, the mounting accuracy is measured by conveying the mounting accuracy measurement board along the board conveyance path, and the two or more component mounting machines sequentially use the mounting accuracy measurement board to measure the mounting accuracy.

17 Claims, 9 Drawing Sheets

(52) U.S. Cl.
CPC ...... *H05K 13/0815* (2018.08); *Y10T 29/4913* (2015.01); *Y10T 29/53174* (2015.01)

(58) Field of Classification Search
USPC ......... 29/832, 407.01, 426.2, 428, 593, 739, 29/740, 759
See application file for complete search history.

(56) References Cited

FOREIGN PATENT DOCUMENTS

| | | |
|---|---|---|
| JP | 2001-7595 A | 1/2001 |
| JP | 2003-142891 A | 5/2003 |
| JP | 2012-54463 A | 3/2012 |
| JP | 2013-149639 A | 8/2013 |
| JP | 2013-258322 A | 12/2013 |
| WO | WO 2015/191833 A1 | 12/2015 |

* cited by examiner

MOUNTING ACCURACY MEASUREMENT SYSTEM FOR COMPONENT MOUNTING LINE, AND MOUNTING ACCURACY MEASUREMENT METHOD

TECHNICAL FIELD

The present specification discloses a technique related to a mounting accuracy measurement system and a mounting accuracy measurement method of a component mounting line, which are configured to measure the mounting accuracy of multiple component mounting machines constituting a component mounting line.

BACKGROUND ART

In general, a component mounting line for producing a component mounting board is configured by arranging multiple component mounting machines along a board conveyance path for conveying a circuit board. When a new component mounting machine is added to or exchanged in this component mounting line, or when a mounting head or a suction nozzle of a component mounting machine is exchanged, it is desirable to measure the mounting accuracy of the component mounting machine before starting production.

As a method for measuring the mounting accuracy of a component mounting machine, for example, as described in Patent Literature 1 (Japanese Patent Application Laid-Open No. 2003-142891), there is a method in which a mounting accuracy measurement component (i.e., a component for testing) is picked up by a suction nozzle and mounted on a mounting accuracy measurement board (i.e., a board for testing), after which the mounting state is image-recognized to measure the deviation in the mounting position of the mounting accuracy measurement component. The above-mentioned Patent Literature 1 does not disclose a method for setting the mounting accuracy measurement board on a component mounting machine, but in the currently performed setting method, an operator opens the front cover of the component mounting machine, which is the target of the mounting accuracy measurement, and sets the mounting accuracy measurement board at a predetermined position in the component mounting machine.

PATENT LITERATURE

Patent Literature 1: JP-A-2003-142891

BRIEF SUMMARY

Technical Problem

As described above, since the component mounting line is configured by arranging multiple component mounting machines, there are cases in which the mounting accuracy of two or more component mounting machines is measured. In these cases, for each of the two or more component mounting machines targeted for mounting accuracy measurement, it is necessary for the operator to repeat the laborious operation of opening the front cover, setting the mounting accuracy measurement board at a predetermined position in the component mounting machine, closing the front cover, measuring the mounting accuracy, and then opening the front cover again, taking out the mounting accuracy measurement board from the inside of the component mounting machine, and closing the front cover, which is extremely troublesome.

Solution to Problem

In order to solve the above-mentioned problem, the present disclosure provides a mounting accuracy measurement system of a component mounting line configured by arranging multiple component mounting machines along a board conveyance path configured to convey a circuit board, wherein each of the multiple component mounting machines is configured to switch between a production mode, in which a component is mounted on the circuit board that is conveyed in and then conveyed out, and a mounting accuracy measurement mode, in which a mounting accuracy measurement component is mounted at a predetermined position on a mounting accuracy measurement board to measure a mounting accuracy thereof; and wherein when the control modes of two or more component mounting machines, among the multiple component mounting machines, are the mounting accuracy measurement mode, the mounting accuracy measurement board is conveyed between at least the two or more component mounting machines along the board conveyance path so that the two or more component mounting machines measure the respective mounting accuracy by sequentially using the mounting accuracy measurement board.

In this manner, since the mounting accuracy of the two or more component mounting machines can be measured by automatically passing, with the board conveyance function of the component mounting line, a single mounting accuracy measurement board sequentially among the two or more component mounting machines, workload for an operator can be greatly reduced and the mounting accuracy of the two or more component mounting machines can be measured efficiently, when the mounting accuracy of two or more component mounting machines is measured.

DESCRIPTION OF EMBODIMENTS

Figure 1:
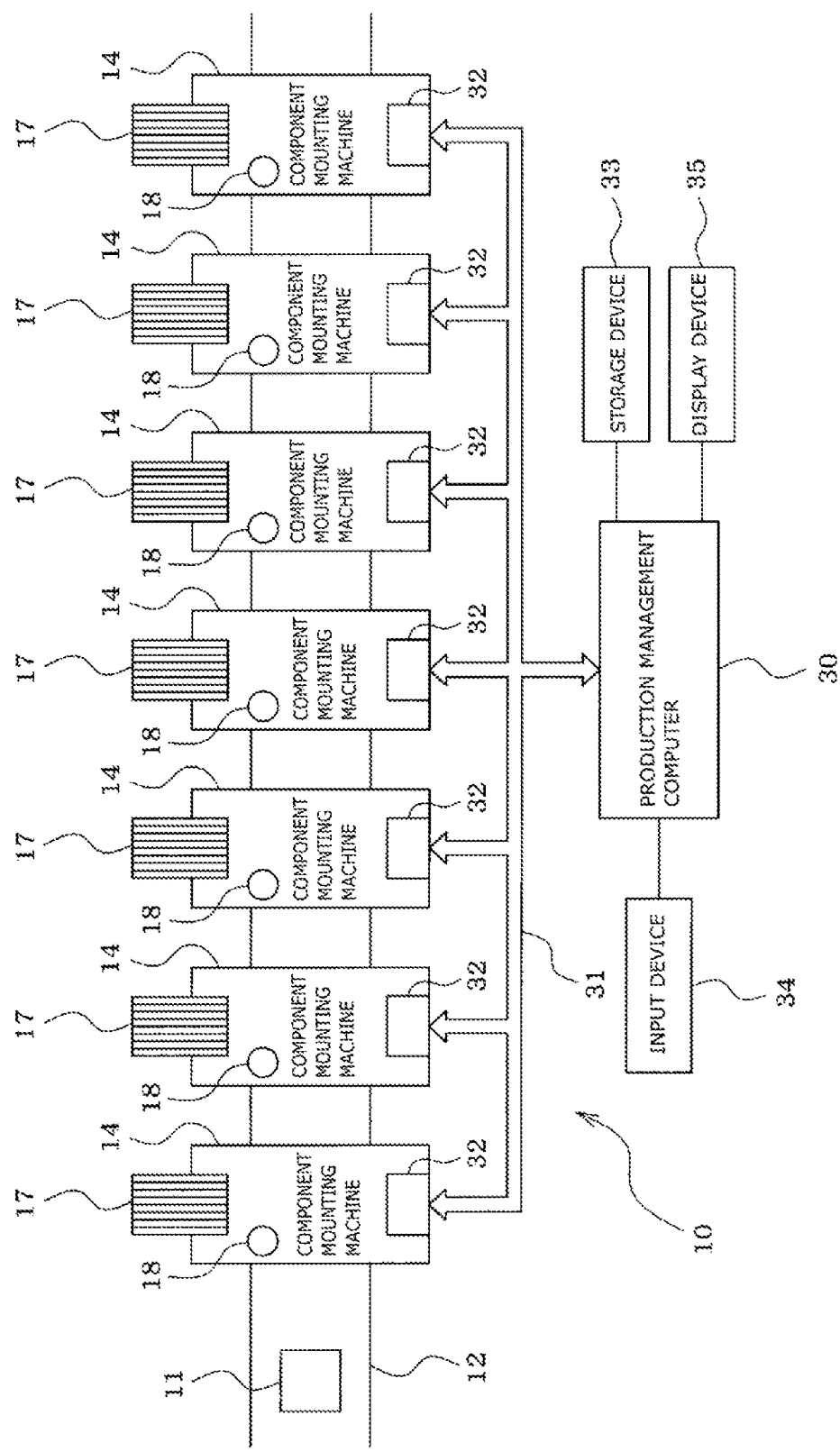
FIG. 1 is a block diagram schematically showing an example of a component mounting line configuration in one embodiment.

Hereinafter, an embodiment will be described. First, the configuration of component mounting line 10 will be described with reference to FIG. 1. Component mounting line 10 is configured by arranging multiple component mounting machines 14 for mounting components on circuit board 11 along a board conveyance path 12 for conveying circuit board 11. In addition, although not shown, there are cases where mounting-related machines, for performing work related to component mounting, are installed on the upstream side and the downstream side of component mounting line 10. Here, mounting-related machines include, for example, solder printing machines, inspection devices, reflow devices, or the like.

Multiple feeders 17 for supplying components are set, in an exchangeable manner, on the feeder setting base (not shown) of each component mounting machine 14. One or multiple suction nozzles (not shown), for picking up components supplied from feeders 17 and mounting them on circuit board 11, are held in mounting head 18, which is installed in component mounting machine 14 in an exchangeable manner.

Figure 2:
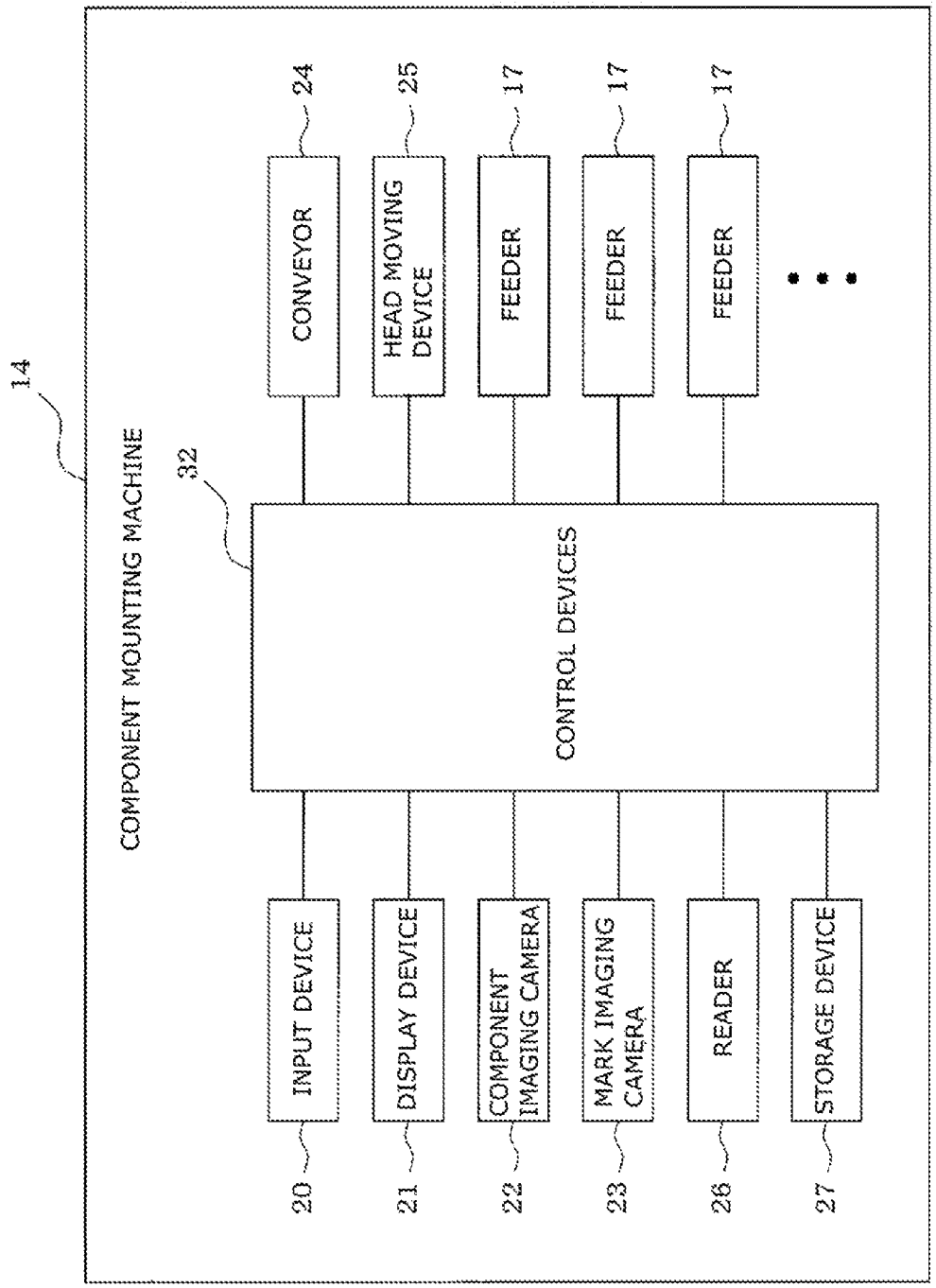
FIG. 2 is a block diagram showing a control system configuration of the component mounting machine.

As shown in FIG. 2, each component mounting machine 14 is provided with input device 20 such as a keyboard, a touch panel, a mouse, a voice recognition device or the like, display device 21 such as a liquid crystal display, CRT or the like, storage device 27 such as RAM, ROM, a hard disk device or the like, component imaging camera 22 for imaging a component picked up by a suction nozzle and for imaging and recognizing a deviation amount of the suction orientation or the suction position of the component, mark imaging camera 23 for imaging a reference mark (not shown) or the like of circuit board 11, conveyor 24 for conveying circuit board 11 or mounting accuracy measurement board 41 (see FIG. 3) to be described later, head moving device 25 for moving mounting head 18 in the XY direction (left, right, front, and rear direction), and the like. The width of conveyor 24 of each component mounting machine 14 is configured to be changeable, and the width of conveyor 24 is changed in accordance with the width of circuit board 11 to be conveyed and the width of mounting accuracy measurement board 41.

As shown in FIG. 1, control devices 32 of the multiple component mounting machines 14 constituting component mounting line 10 are connected to production management computer 30, which manages production of component mounting line 10, via network 31 such that the devices can communicate with each other. Network 31 may be configured in any manner, and, for example, when multiple component mounting devices 14 are mounted on one base (not shown), control devices 32 of component mounting machines 14 may be connected to each other via a communication line in the base, or control devices 32 of component mounting machines 14 may be connected to each other by communication cables or the like.

Control device 32 of each component mounting machine 14 is configured by one or multiple computers (CPUs) and repeats the operation of moving mounting head 18 along the sequential path of component suction position, component imaging position, component mounting position in accordance with a production job (production program) transmitted from production management computer 30, picking up the component supplied from feeder 17 with a suction nozzle of mounting head 18, images the component with component imaging camera 22, recognizing the deviation amount of the component suction position and the like, and mounting the component on circuit board 11, and in this way mounts a predetermined number of components on circuit board 11 to produce a component mounting board.

Next, the mounting accuracy measurement system of each component mounting machine 14 of component mounting line 10 will be described.

Figure 4:
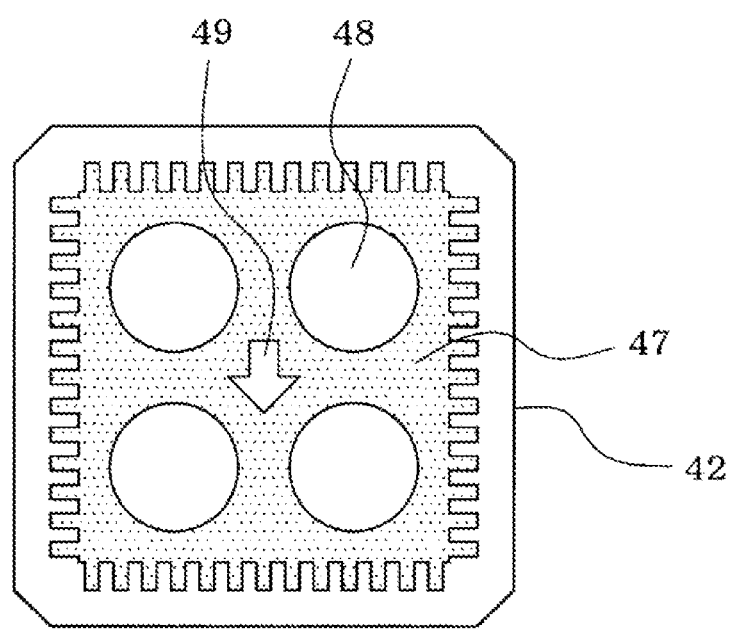
FIG. 4 is an enlarged plan view of a mounting accuracy measurement component made of glass.

When measuring the mounting accuracy of component mounting machine 14, mounting accuracy measurement component 42 (see FIGS. 4 and 5) is mounted at a predetermined position on mounting accuracy measurement board 41 by being picked up by a suction nozzle of mounting head 18, the mounting state imaged by mark imaging camera 23, and the deviation amount in the mounting position is measured by image processing. The mounting accuracy may be measured after the suction nozzle held by mounting head 18 of component mounting machine 14, which is the target of the mounting accuracy measurement, is exchanged with a mounting accuracy measurement nozzle (not shown).

Mounting accuracy measurement board 41 is used by two or more component mounting machines 14 targeted for mounting accuracy measurement. Accordingly, mounting accuracy measurement board 41 has many component mounting areas for mounting the mounting accuracy measurement component 42, used in two or more component mounting machines 14, and mounting accuracy measurement board 41 has a predetermined number (e.g., four) of measurement reference marks 46 in a predetermined positional relationship in each component mounting area.

The number of components 42 for measuring the mounting accuracy is the same as the number of suction nozzles for each component mounting machine 14. In component mounting machine 14 targeted for mounting accuracy measurement, a mounting accuracy measurement component supply unit (not shown) is set, on which a required number of mounting accuracy measurement components 42 are mounted. The component supply unit for measuring mounting accuracy may be set on the feeder setting base of component mounting machine 14, so as to be exchangeable with feeder 17, or set in an empty space in component mounting machine 14.

Figure 3:
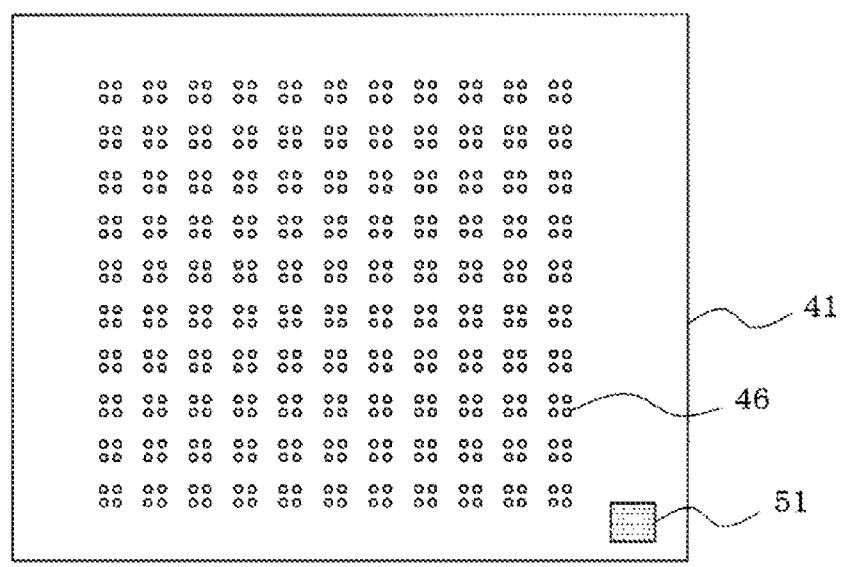
FIG. 3 is a plan view of a mounting accuracy measurement board.
Figure 5:
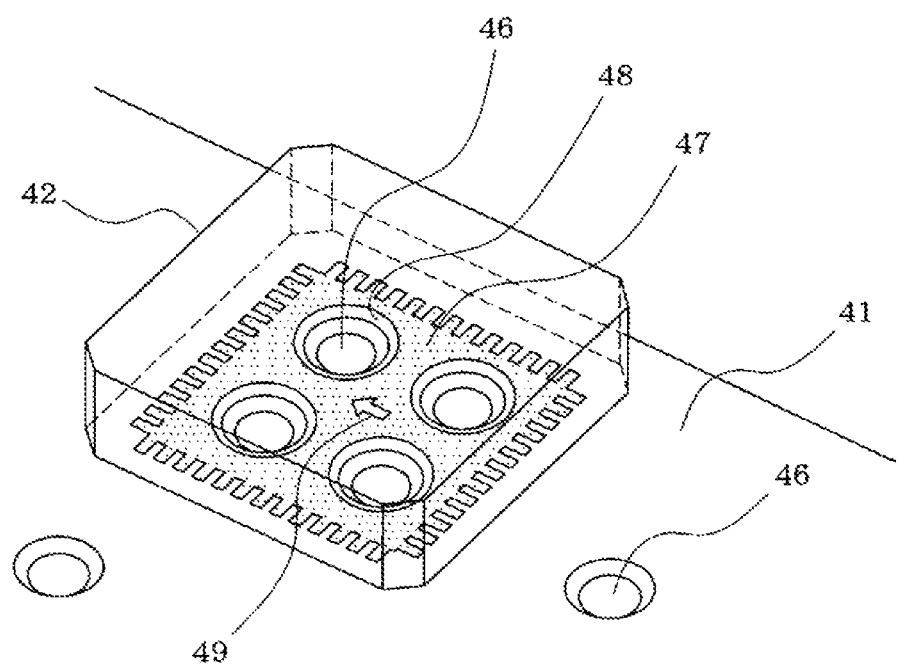
FIG. 5 is an enlarged perspective view showing a state in which the mounting accuracy measurement component made of glass is mounted on the mounting accuracy measurement board.

Mounting accuracy measurement component 42 is made of, for example, glass, and having on its lower face, as shown in FIG. 3, an opaque graphic pattern 47 resembling the outer shape of an IC chip with leads, and transparent window portion 48 slightly larger than measurement reference mark 46 at a position corresponding to measurement reference mark 46 of mounting accuracy measurement board 41 in graphic pattern 47. As a result, as shown in FIG. 5, when mounting accuracy measurement component 42 made of glass is mounted in a predetermined component mounting area of mounting accuracy measurement board 41, mark imaging camera 23 images, from above, window portion 48 of graphic pattern 47 of mounting accuracy measurement component 42 overlapping measurement reference mark 46, and the image is processed so that the deviation amount of the mounting position of mounting accuracy measurement component 42 with respect to measurement reference mark 46 (i.e., the positional deviation amount of graphic pattern 47 of mounting accuracy measurement component 42 with respect to measurement reference mark 46) is measured and taken as a measurement of the mounting accuracy. Note that graphic pattern 47 of mounting accuracy measurement component 42 has arrow mark 49 indicating the direction of mounting accuracy measurement component 42.

Board information recording portion 51 that records (describes) or stores information of mounting accuracy measurement board 41 (hereinafter referred to as "board information") is provided outside the component mounting area on the upper face of mounting accuracy measurement board 41. Board information recording portion 51 records or stores, as board information, a board ID (board identification information), information on the width of mounting accuracy measurement board 41, and the like. Board information recording portion 51 may record a code such as a bar code or a two-dimensional code, or may use an electronic tag for electronic storage, a magnetic tape for magnetic recording, or the like. Circuit board 11 is also provided with a board information recording portion (not shown) which records or stores board information such as the board ID.

Reader 26 (board information reading portion) for reading board information from board information recording portion 51 of mounting accuracy measurement board 41 is provided in the most upstream component mounting machine or each of the multiple component mounting machines 14 of component mounting line 10. When reader 26 is installed in the most upstream portion of component mounting line 10, each of the multiple component mounting machines 14 acquires board information read by reader 26 in the most upstream component mounting machine 14 of component mounting line 10 via network 31. For example, board information read by reader 26 in the most upstream component mounting machine 14 of component mounting line 10 may be sequentially transmitted from component mounting machine 14 on the upstream side to component mounting machine 14 on the downstream side, or board information read by reader 26 in the most upstream component mounting machine 14 of component mounting line 10 may be transmitted to production management computer 30 and then transmitted from production management computer 30 to each component mounting machine 14. In the case where each of multiple component mounting machines 14 is provided with reader 26, board information read by each reader 26 is acquired. The mounting accuracy measurement operation control program of FIGS. 6 to 9, which will be described later, employs a method of sequentially transmitting board information of mounting accuracy measurement board 41 from component mounting machine 14 on the upstream side to component mounting machine 14 on the downstream side.

Incidentally, board information recording portion 51 of mounting accuracy measurement board 41 may record or store only the board ID, the width information of mounting accuracy measurement board 41 may be registered in association with the board ID in storage device 33 of production management computer 30, the board ID read by reader 26 may be transmitted to production management computer 30, and production management computer 30 may retrieve the width information of mounting accuracy measurement board 41 corresponding to the received board ID from the registration data of storage device 33 and transmit the width information to control device 32 of each component mounting machine 14.

Otherwise, the operator may operate input device 20 of component mounting machine 14, which is measuring the mounting accuracy, and input board information of mounting accuracy measurement board 41 into control device 32 of component mounting machine 14. Alternatively, the operator may operate input device 34 of production management computer 30 to input board information of mounting accuracy measurement board 41 into production management computer 30, and board information of mounting accuracy measurement board 41 may be transmitted from production management computer 30 to control device 32 of each component mounting machine 14.

Each of the multiple component mounting machines 14 constituting component mounting line 10 is configured to switch between a production mode in which a component is mounted on circuit board 11 which has been conveyed in and is to be conveyed out after mounting, a mounting accuracy measurement mode in which mounting accuracy measurement component 42 is mounted at a predetermined position of mounting accuracy measurement board 41 to measure its mounting accuracy, and a pass mode in which a board conveyed in (i.e., circuit board 11 or mounting accuracy measurement board 41) is conveyed out without a component being mounted on the board. As a method of switching the operation mode of each component mounting machine 14, the operator may manually switch the control mode by operating input device 20 of each component mounting machine 14, or the production management computer 30 may monitor the production progress state of each component mounting machine 14, the conveyance state of mounting accuracy measurement board 41, and the like, and transmit a control mode switching signal to control device 32 of each component mounting machine 14 based on the monitoring result to automatically switch the control mode of each component mounting machine 14.

In the present embodiment, when the control mode of two or more component mounting machines 14 among the multiple component mounting machines 14 constituting component mounting line 10 is the mounting accuracy measurement mode, mounting accuracy measurement board 41 is conveyed along board conveyance path 12 at least between the two or more component mounting machines 14 so that the two or more component mounting machines 14 measure the mounting accuracy using mounting accuracy measurement board 41 sequentially.

In this case, the operator may set mounting accuracy measurement board 41 on component mounting machine 14 in the most upstream component mounting machine 14 in the mounting accuracy measurement mode. Alternatively, mounting accuracy measurement board 41 may be inserted into the most upstream portion of component mounting line 10 and mounting accuracy measurement board 41 may be conveyed to component mounting machine 14 in the mounting accuracy measurement mode by the board conveyance function of component mounting line 10.

When any component mounting machine 14 is the most upstream component mounting machine 14 among the component mounting machines 14 in the mounting accuracy measurement mode, the operator may be guided to set mounting accuracy measurement board 41 in the most upstream component mounting machine 14 (i.e., itself) by displaying the guidance on display device 21 of the most upstream component mounting machine 14 or by the guidance voice.

In the case that production management computer 30 can recognize component mounting machine 14 in the mounting accuracy measurement mode, production management computer 30 may designate the most upstream component mounting machine 14 among the component mounting machines in the mounting accuracy measurement mode, and may display the guidance for the operator to set mounting accuracy measurement board 41, on display device 21 of the most upstream component mounting machine 14 and/or display device 35 of production management computer 30, or guide the operator by the guidance voice. The above-mentioned guidance to the operator may be provided by display or voice to a portable terminal (not shown) carried by the operator.

Control device 32 of component mounting machine 14 in the production mode automatically changes the width of conveyor 24 in accordance with the width of circuit board 11 to be conveyed in. Control device 32 of component mounting machine 14 in the mounting accuracy measurement mode automatically changes the width of conveyor 24 in accordance with the width of mounting accuracy measurement board 41 to be conveyed in. Control device 32 of component mounting machine 14 in the pass mode automatically changes the width of conveyor 24 in accordance with the width of the board (i.e., mounting accuracy measurement board 41 or circuit board 11) to be passed through.

Control device 32 of each component mounting machine 14 acquires information on whether the board to be conveyed in is mounting accuracy measurement board 41 or circuit board 11 and information on the board width from production management computer 30 or component mounting machine 14 on the upstream side. Here, "component mounting machine 14 on the upstream side" refers to one component mounting machine 14 adjacent to the board convey-in side of the current component mounting machine 14 (hereinafter as well).

When the control mode of component mounting machine 14 on the downstream side is the production mode, control device 32 of the component mounting machine 14 in the mounting accuracy measurement mode causes mounting accuracy measurement board 41 to stand by without being conveyed out to component mounting machine 14 on the downstream side. This prevents mounting accuracy measurement board 41 from being conveyed into component mounting machine 14 in the production mode and being mounted with electronic components. Here, "component mounting machine 14 on the downstream side" refers to one component mounting machine 14 adjacent to the board convey-out side of the current machine (hereinafter as well).

Additionally, when the control mode of component mounting machine 14 on the downstream side is the pass mode, control device 32 of component mounting machine 14 in the mounting accuracy measurement mode conveys out mounting accuracy measurement board 41 to component mounting machine 14 on the downstream side after the end of the mounting accuracy measurement. As a result, even when component mounting machine 14 in the pass mode is in between two component mounting machines 14 in the mounting accuracy measurement mode, mounting accuracy measurement board 41, which is conveyed out from component mounting machine 14 in the mounting accuracy measurement mode on the upstream side, can be conveyed to component mounting machine 14 in the mounting accuracy measurement mode on the downstream side by passing mounting accuracy measurement board 41 through component mounting machine 14 in the pass mode.

Further, when component mounting machine 14 in the mounting accuracy measurement mode is the most downstream component mounting machine 14 among the multiple component mounting machines 14 in component mounting line 10, control device 32 causes mounting accuracy measurement board 41 to stand by without being conveyed out even after the end of the mounting accuracy measurement. Since mounting-related machines such as the inspection device and the reflow device are disposed on the downstream side of the most downstream component mounting machine 14, causing mounting accuracy measurement board 41 to stand by without being conveyed out prevents mounting accuracy measurement board 41 from being conveyed from the most downstream component mounting machine 14 to these mounting-related machines after the end of the mounting accuracy measurement.

On the other hand, when the control mode of component mounting machine 14 on the downstream side is the mounting accuracy measurement mode, the control device 32 of component mounting machine 14 in the pass mode conveys out the conveyed-in mounting accuracy measurement board 41 directly to component mounting machine 14 on the downstream side. In this way, mounting accuracy measurement board 41 from component mounting machine 14 in the pass mode is conveyed to component mounting machine 14 in the mounting accuracy measurement mode.

When the control mode of component mounting machine 14 on the downstream side is the production mode, control device 32 of component mounting machine 14 in the pass mode causes mounting accuracy measurement board 41 conveyed in to stand by without being conveyed out to component mounting machine 41 on the downstream side. This prevents mounting accuracy measurement board 41 from being conveyed into component mounting machine 14 in the production mode and being mounted with electronic components.

When the current machine is the most downstream component mounting machine 14 among the multiple component mounting machines 14, control device 32 of component mounting machine in the pass mode stands by without conveying out conveyed-in mounting accuracy measurement board 41. This prevents mounting accuracy measurement board 41 from being conveyed from the most downstream component mounting machine 14 in the pass mode to the mounting-related machine.

Control device 32 of each component mounting machine 14 acquires information, from production management computer 30 or control device 32 of each component mounting machine 14 on the upstream side and the downstream side, about the control mode of each component mounting machine 14 on the upstream side and the downstream side.

In the case where mounting accuracy measurement board 41 is not conveyed out and is in a standby state, control device 32 of each component mounting machine 14 guides the operator to taking out mounting accuracy measurement board 41 by displaying guidance on display device 21 or by the guidance voice.

Alternatively, when production management computer 30 can recognize component mounting machine 14 that is in a standby state without conveying out mounting accuracy measurement board 41, production management computer 30 may designate component mounting machine 14 and may guide the operator to taking out mounting accuracy measurement board 41 from component mounting machine 14 by displaying guidance on display device 35 of production management computer 30 or by the guidance voice. The above-mentioned guidance to the operator may be provided by display or voice to a portable terminal (not shown) carried by the worker.

The mounting accuracy measurement of each component mounting machine 14 of component mounting line 10 of the present embodiment described above is executed for each component mounting machine 14 by, for example, control device 32 of each component mounting machine 14 in accordance with the mounting accuracy measurement operation control program shown in FIGS. 6 to 9. The mounting accuracy measurement operation control program shown in FIGS. 6 to 9 is installed in storage device 27 of each component mounting machine 14. The processing content of the mounting accuracy measurement operation control program shown in FIGS. 6 to 9 will be described below.

Figure 6:
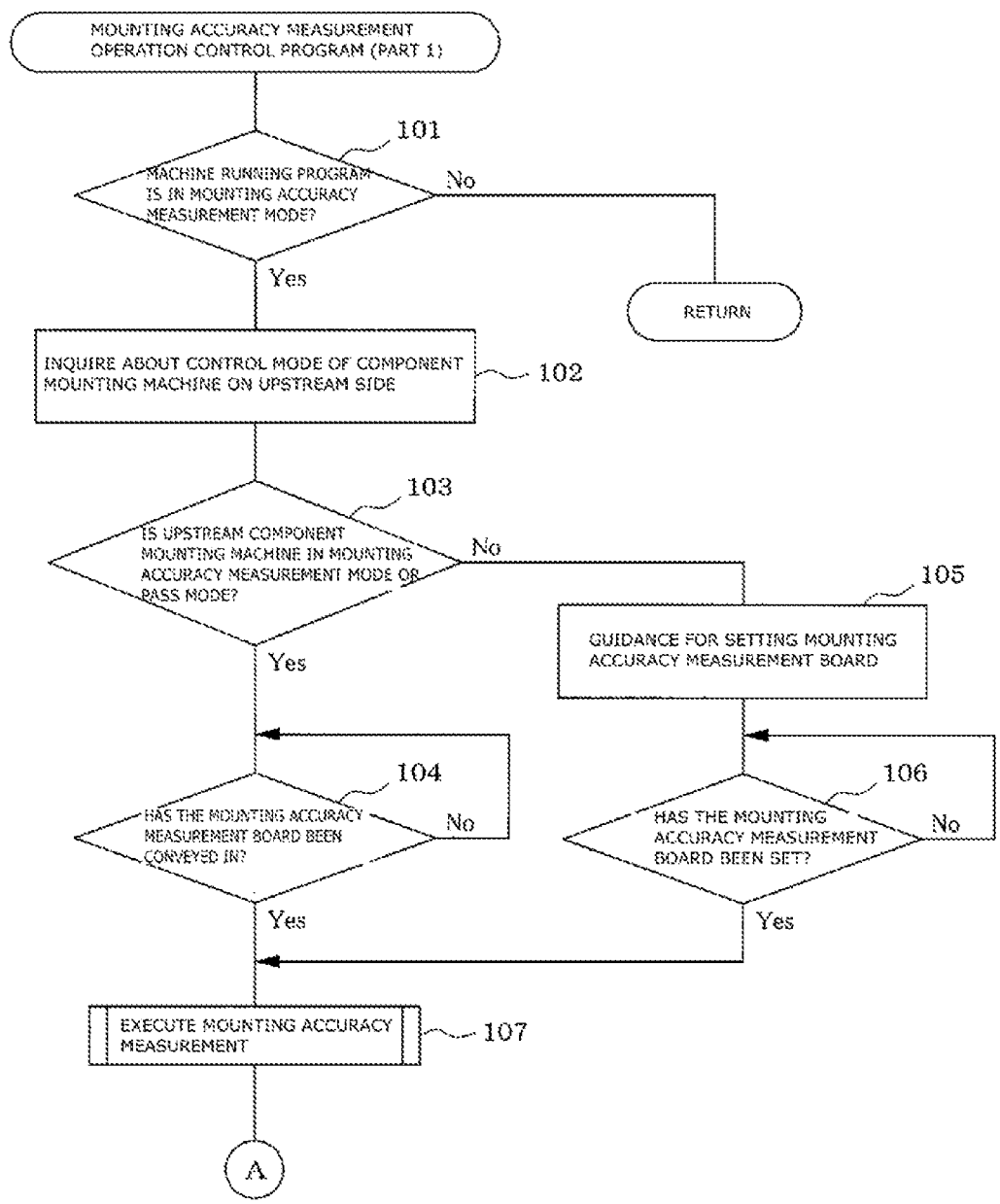
FIG. 6 is a flowchart showing a process flow of the first half of mounting accuracy measurement operation control program (1).
Figure 7:
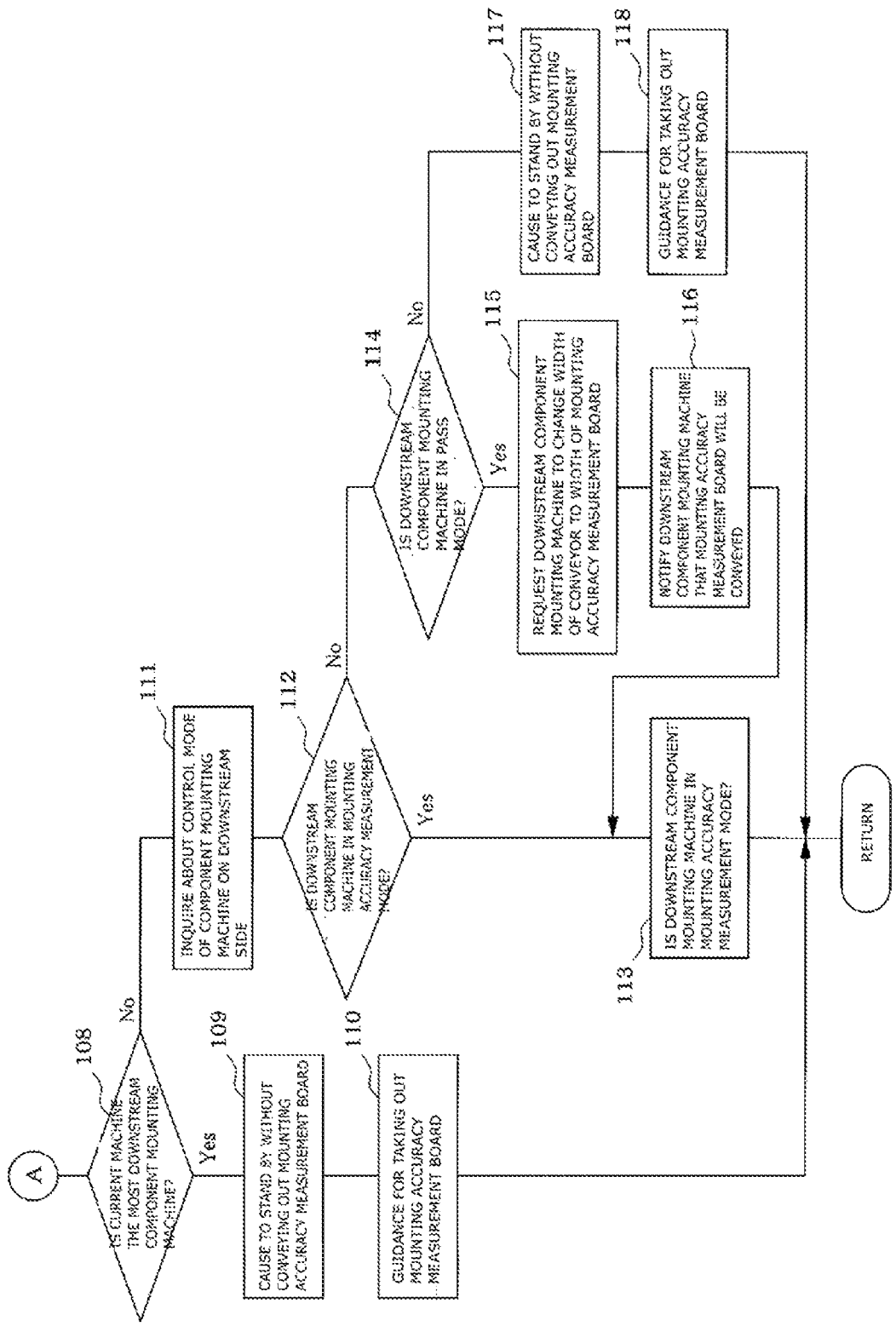
FIG. 7 is a flowchart showing the process flow in the latter half of mounting accuracy measurement operation control program (1).

Control device 32 of each component mounting machine 14 repeatedly executes the mounting accuracy measurement operation control program (part 1) of FIGS. 6 and 7 at a predetermined cycling period while the power is turned on. When control device 32 of each component mounting machine 14 starts the mounting accuracy measurement operation control program (part 1) of FIGS. 6 and 7, first, in step 101, it is determined whether the control mode of component mounting machine 14 running the control program is the mounting accuracy measurement mode, and if it is not the mounting accuracy measurement mode, control device 32 ends the program without performing subsequent processing.

On the other hand, if the control mode of component mounting machine 14 running the control program is the mounting accuracy measurement mode, the process proceeds to step 102, inquires component mounting machine 14 on the upstream side (or production management computer 30) about the control mode of component mounting machine 14 on the upstream side, and in the next step 103, it is determined whether the control mode of component mounting machine 14 on the upstream side is the mounting accuracy measurement mode or the pass mode. As a result, when it is determined that the control mode of component mounting machine 14 on the upstream side is neither the mounting accuracy measurement mode nor the pass mode, that is, when it is determined that the control mode of component mounting machine 14 on the upstream side is the production mode, since mounting accuracy measurement board 41 is not conveyed from component mounting machine 14 on the upstream side, the process proceeds to step 105, and the operator is guided by display or voice in setting mounting accuracy measurement board 41 in the current component mounting machine 14.

In the case where the control mode of two or more component mounting machines 14 of multiple component mounting machines 14 constituting component mounting line 10 is the mounting accuracy measurement mode, if the control mode of component mounting machine 14 on the upstream side of the machine is the production mode, it means that the current machine is the most upstream component mounting machine 14 of the two or more component mounting machines 14 in the mounting accuracy measurement mode. This is because the control mode of component mounting machine 14 positioned between two or more component mounting machines 14 in the mounting accuracy measurement mode is switched to the pass mode.

Thereafter, the process proceeds to step 106, where the mounting accuracy measurement board 41 is made to stand by until it is set in the current machine, and when mounting accuracy measurement board 41 is set, the process proceeds to step 107, where mounting accuracy measurement component 42 is picked up by each suction nozzle of mounting head 18 of the current machine and mounted on a predetermined position of mounting accuracy measurement board 41, the mounting state is imaged by mark imaging camera 23, and the mounting accuracy measurement is performed, by image processing, to measure the deviation amount of the mounting position.

On the other hand, when it is determined in the above step 103 that the control mode of component mounting machine 14 on the upstream side is the mounting accuracy measurement mode or the pass mode, the process proceeds to step 104, stands by until mounting accuracy measurement board 41 is conveyed in from component mounting machine 14 on the upstream side, and proceeds to step 107 at the time at which mounting accuracy measurement board 41 is conveyed in and executes the above-described mounting accuracy measurement.

After the end of the mounting accuracy measurement, the process proceeds to step 108 in FIG. 7, where it is determined whether the current device is the most downstream component mounting device 14 of the multiple component mounting devices 14 in component mounting line 10. As a result, if it is determined that component mounting machine 14 is the most downstream component mounting machine 14 (i.e., there is no component mounting machine 14 on the downstream side), the process proceeds to step 109, where mounting accuracy measurement board 41 is not conveyed out even after the end of the mounting accuracy measurement but is made to stand by, and in the next step, step 110, the operator is guided by display or voice in taking out mounting accuracy measurement board 41 and the present program is ended.

On the other hand, if it is determined in the above step 108 that component mounting machine 14 is not the most downstream component mounting machine 14 (that is, there is component mounting machine 14 on the downstream side), the process proceeds to step 111, inquires component mounting machine 14 on the downstream side (or production management computer 30) about the control mode of component mounting machine 14 on the downstream side, and in the next step, step 112, it is determined whether the control mode of component mounting machine 14 on the downstream side is the mounting accuracy measurement mode. As a result, if it is determined that the control mode of component mounting machine 14 on the downstream side is the mounting accuracy measurement mode, the process proceeds to step 113, mounting accuracy measurement board 41 is conveyed out to component mounting machine 14 on the downstream side, and the present program is ended.

On the other hand, if it is determined in step 112 that the control mode of component mounting machine 14 on the downstream side is not the mounting accuracy measurement mode, the process proceeds to step 114, and it is determined whether the control mode of component mounting machine 14 on the downstream side is the pass mode. As a result, if it is determined that the control mode of the component mounting machine 14 on the downstream side is the pass mode, the process proceeds to step 115, where component mounting machine 14 on the downstream side is requested to change the width of conveyor 24 to the width of mounting accuracy measurement board 41, and in the next step, step 116, component mounting machine 14 on the downstream side is notified that mounting accuracy measurement board 41 will be conveyed and the present program is ended.

If it is determined in step 114 that the control mode of component mounting machine 14 on the downstream side is not the pass mode (i.e., the production mode), the process proceeds to step 117, where mounting accuracy measurement board 41 is not conveyed out after the end of the mounting accuracy measurement but is made to stand by without being conveyed out, and in step 118, the operator is guided by display or voice in taking out mounting accuracy measurement board 41 and the present program is ended.

Figure 8:
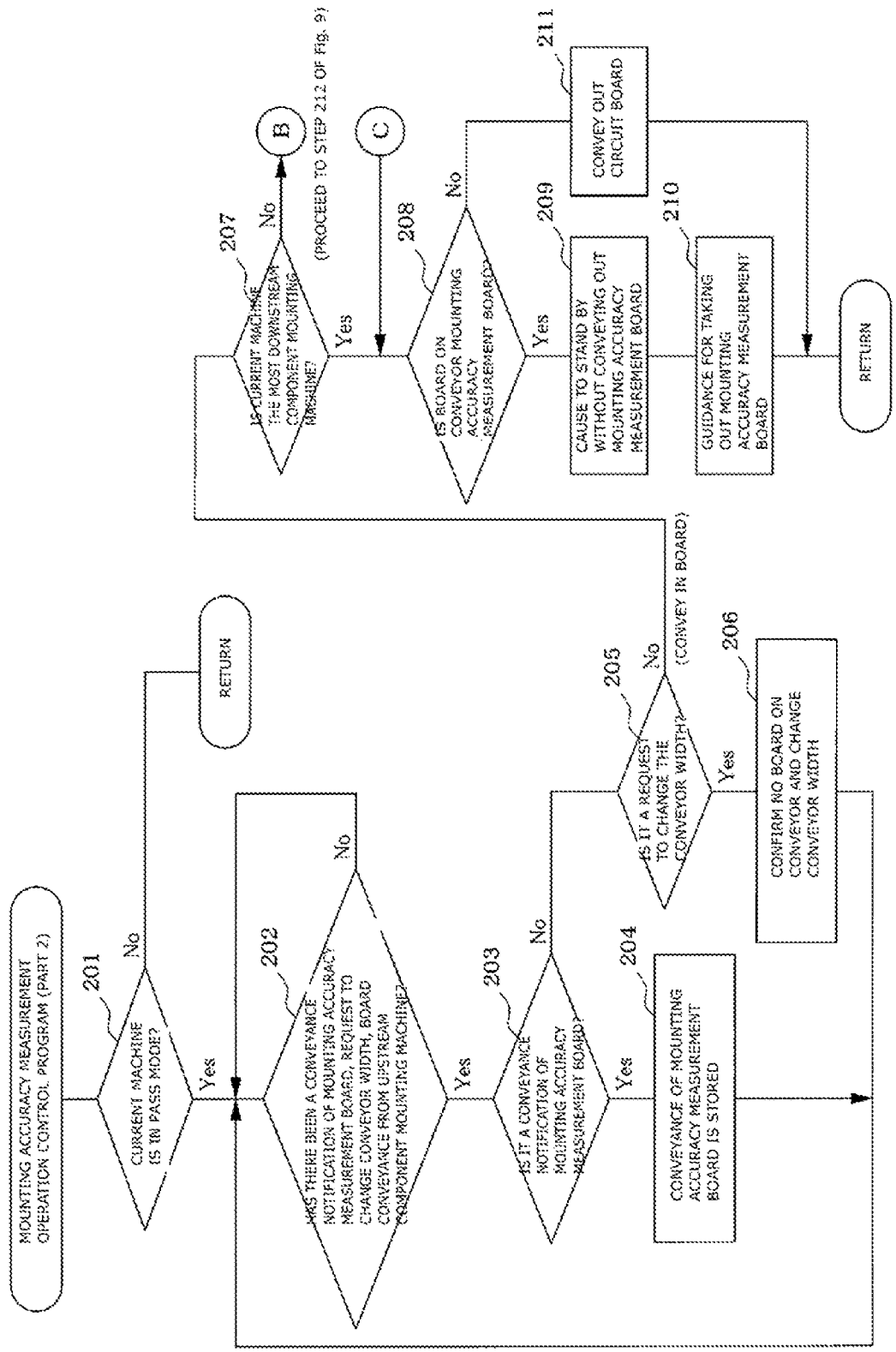
FIG. 8 is a flowchart showing the process flow in the first half of mounting accuracy measurement operation control program (2).
Figure 9:
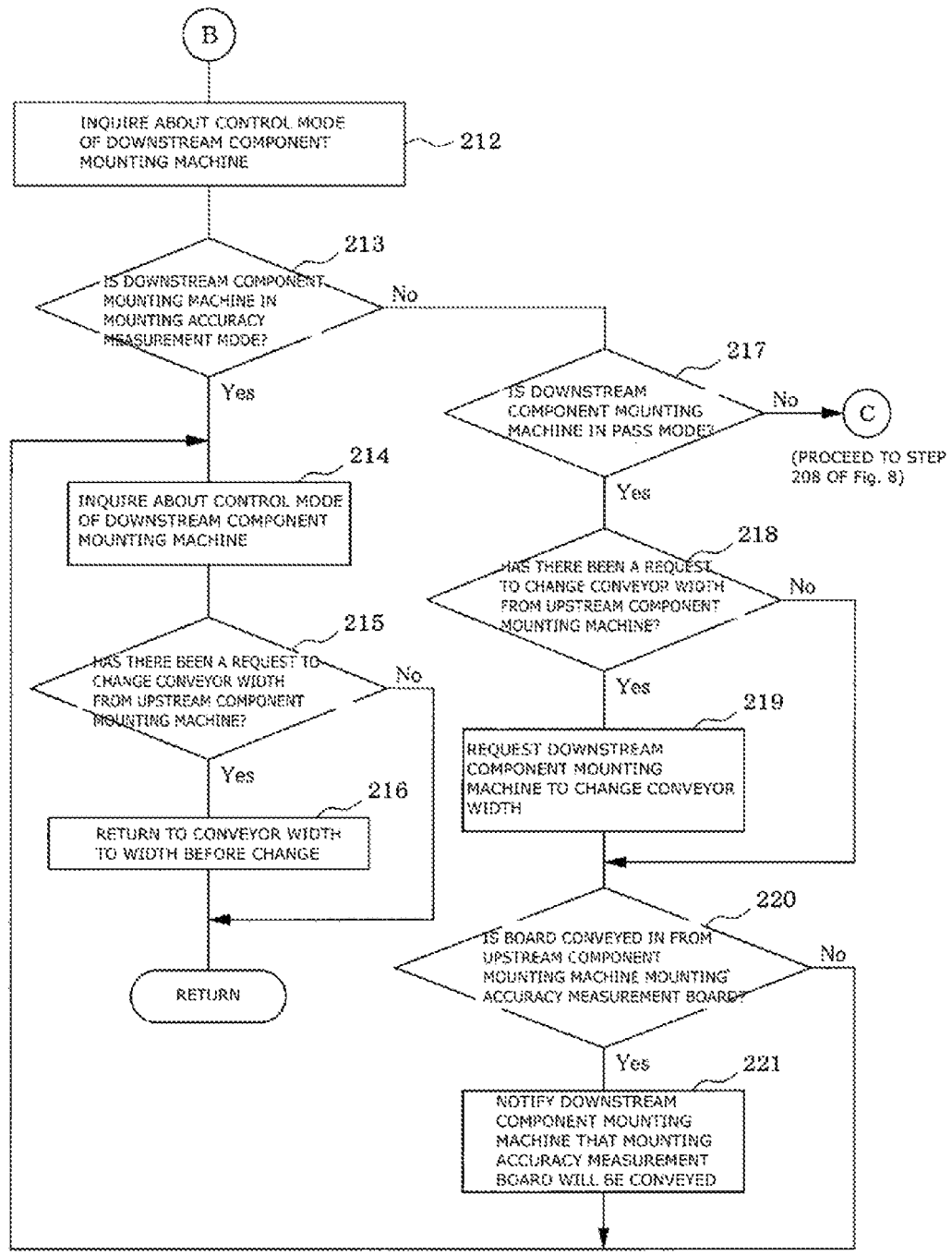
FIG. 9 is a flowchart showing the process flow in the second half of mounting accuracy measurement operation control program (2).

Mounting accuracy measurement operation control program (part 2) of FIGS. 8 and 9 is also repeatedly executed by control device 32 of each component mounting machine 14 at a predetermined cycling period. When control device 32 of each component mounting machine 14 starts mounting accuracy measurement operation control program (part 2) of FIGS. 8 and 9, first, in step 201, it is determined whether the control mode of component mounting machine 14 is the pass mode, and if it is not the pass mode, control device 32 ends the program without performing subsequent processing.

On the other hand, if the control mode of the current device is the pass mode, the process proceeds to step 202 and stands by until any one of the following (1) to (3) occurs:

(1) Conveyance notification of mounting accuracy measurement board 41 from component mounting machine 14 on the upstream side (2) Request to change the width of conveyor 24 from component mounting machine 14 on the upstream side (3) Conveying in a board from component mounting machine 14 on the upstream side Thereafter, when any one of the above (1) to (3) occurs, the process proceeds to step 203, where it is determined whether a conveyance notification of mounting accuracy measurement board 41 from component mounting machine 14 on the upstream side has occurred, and if a conveyance notification of mounting accuracy measurement board 41 has occurred, the process proceeds to step 204, where it is stored that mounting accuracy measurement board 41 will be conveyed from component mounting machine 14 on the upstream side, and the process returns to step 202.

Thereafter, when (2) or (3) above is present, the process sequentially proceeds to steps 202, 203, 205 and determines whether it is a request to change the width of conveyor 24 from component mounting machine 14 on the upstream side, and if it is a request to change the width of conveyor 24, the process proceeds to step 206 to confirm that there is no board on conveyor 24 and changes the width of conveyor 24, and then the process returns to step 202.

Thereafter, at the point of time at which the board is conveyed in from the component mounting machine 14 on the upstream side, the process sequentially proceeds to steps 202, 203, 205, 207, where it is determined whether the current machine is the most downstream component mounting machine 14 among the multiple component mounting machines 14 of component mounting line 10, and if it is determined that the current machine is the most downstream component mounting machine 14 (that is, there is no component mounting machine 14 on the downstream side), the process proceeds to step 208, where it is determined whether the board on conveyor 24 is mounting accuracy measurement board 41. As a result, if it is determined that the board on conveyor 24 is mounting accuracy measurement board 41, the process proceeds to step 209, where the mounting accuracy measurement board 41 is not conveyed out even after the end of the mounting accuracy measurement, and in the next step, step 210, the operator is guided by display or voice in taking out mounting accuracy measurement board 41 and the present program is ended.

On the other hand, if it is determined in step 208 that the board on conveyor 24 is not mounting accuracy measurement board 41 (i.e., the board is circuit board 11), the process proceeds to step 211, circuit board 11 is conveyed out, and the present program is ended.

On the other hand, if it is determined in the above step 207 that the device is not the most downstream component mounting machine 14 (i.e., another component mounting machine 14 is on the downstream side), the process proceeds to step 212 in FIG. 9, inquires component mounting machine 14 on the downstream side (or production management computer 30) about the control mode of component mounting machine 14 on the downstream side, and in the next step, step 213, it is determined whether the control mode of component mounting machine 14 on the downstream side is the mounting accuracy measurement mode. As a result, if it is determined that the control mode of component mounting machine 14 on the downstream side is the mounting accuracy measurement mode, the process proceeds to step 214, and mounting accuracy measurement board 41 is conveyed out to component mounting machine 14 on the downstream side.

Then, in the next step, step 215, it is determined whether there is a request to change the width of conveyor 24 from component mounting machine 14 on the upstream side (that is, whether the width of conveyor 24 has been changed), and if it is determined that there is a request to change the width of conveyor 24, the process proceeds to step 216, the width of conveyor 24 is returned to the width before the change, and the present program is ended.

If it is determined in step 215 that there is no request to change the width of conveyor 24 from component mounting machine 14 on the upstream side, it is determined that there is no need to change the width of conveyor 24 and the program ends.

On the other hand, if it is determined in step 213 that the control mode of component mounting machine 14 on the downstream side is not the mounting accuracy measurement mode, the process proceeds to step 217, where it is determined whether the control mode of the downstream component mounting machine 14 is the pass mode. As a result, if it is determined that the control mode of the component mounting machine 14 on the downstream side is the pass mode, the process proceeds to step 218, where it is determined whether a request to change the width of conveyor 24 has been made by component mounting machine 14 on the upstream side (that is, whether the width of conveyor 24 has been changed), and if it is determined that a request to change the width of the conveyor 24 has been made, the process proceeds to step 219, where component mounting machine 14 on the downstream side is requested to change the width of conveyor 24 to the width of the board to be conveyed out of the component mounting machine, and the process proceeds to step 220. If it is determined in step 218 that there has been no request to change the width of conveyor 24, the process proceeds directly to step 220.

In this step 220, it is determined whether the board conveyed from component mounting machine 14 on the upstream side is mounting accuracy measurement board 41, and if it is mounting accuracy measurement board 41, the process proceeds to step 221, the process notifies component mounting machine 14 on the downstream side that mounting accuracy measurement board 41 is conveyed, and the process proceeds to step 214. If it is determined in step 220 that the board conveyed from component mounting machine 14 on the upstream side is not mounting accuracy measurement board 41 (i.e., the board is circuit board 11), the process proceeds directly to step 214.

Thereafter, by the processes of steps 214 to 216, the board is conveyed out to component mounting machine 14 on the downstream side, and if there is a request to change the width of conveyor 24 from component mounting machine 14 on the upstream side, the width of conveyor 24 is returned to the width before the change, and if there is no request to change the width of conveyor 24 from component mounting machine 14 on the upstream side, the program is ended.

When it is determined in steps 213 to 217 that the control mode of the component mounting machine 14 on the downstream side is neither the mounting accuracy measurement mode nor the pass mode, that is, when it is determined that it is the production mode, the processes in and after step 208 of FIG. 8 are executed. As a result, when the board on conveyor 24 is circuit board 41, circuit board 41 is conveyed out (steps 208, 211), and when the board on conveyor 24 is mounting accuracy measurement board 41, mounting accuracy measurement board 41 is not conveyed out but made to stand by even after the end of the mounting accuracy measurement, and the operator is guided in taking out mounting accuracy measurement board 41 by display or voice (steps 208, 209, 210).

When a mounting-related machine such as an inspection device is disposed between multiple component mounting machines 14 constituting component mounting line 10, the control mode of the mounting-related machine may be configured to switch between the production mode and the pass mode, and when the mounting accuracy measurement operation control program of FIGS. 6 to 9 is executed, the mounting-related machine in the production mode may be handled in the same manner as component mounting machine 14 in the production mode, and the mounting-related machine of the pass mode may be handled in the same manner as component mounting machine 14 in the pass mode.

With the present embodiment described above, in the case where the control mode of two or more component mounting machines 14 among the multiple component mounting machines 14 constituting component mounting line 10 is the mounting accuracy measurement mode, conveying mounting accuracy measurement board 41 along board conveyance path 12 between at least the two component mounting machines 14 enables sequential measurement of the mounting accuracy of the two component mounting machines 14 with mounting accuracy measurement board 41, thereby enabling sequential measurement of the mounting accuracy of the two component mounting machines 14 by automatically passing, using the board conveyance function of component mounting line 10, a single mounting accuracy measurement board 41 between the two component mounting machines 14. As a result, when the mounting accuracy of two or more component mounting machines 14 is measured, the amount of work performed by the operator is greatly reduced and the mounting accuracy of two or more component mounting machines can be measured efficiently.

It is needless to say that the present disclosure is not limited to the above-described embodiment, and can be implemented by various changes within a range not deviating from the gist of the disclosure, including changes to the configuration of component mounting line 10, the configuration of component mounting machine 14, the configuration of mounting accuracy measurement board 41, the configuration of mounting accuracy measurement component 42, and the like.

REFERENCE SIGNS LIST

10 . . . Component mounting line, 11 . . . Circuit board, 12 . . . Board conveyance path, 14 . . . Component mounting machine, 17 . . . Feeder, 18 . . . Mounting head, 21 . . . Display device, 22 . . . Camera for component imaging, 23 . . . Camera for mark imaging, 24 . . . Conveyor, 30 . . . Production control computer (production control device), 31 . . . Network, 32 . . . Control device of component mounting machine, 41 . . . Mounting accuracy measurement board, 42 . . . Mounting accuracy measurement component

The invention claimed is:

1. A mounting accuracy measurement system of a component mounting line comprising:
multiple component mounting machines arranged along a board conveyance path configured to convey a circuit board, each of the multiple component mounting machines including a control device configured to switch between a production mode, in which a component is mounted on the circuit board that is conveyed in and then conveyed out, and a mounting accuracy measurement mode, in which a mounting accuracy measurement component is mounted at a predetermined position on a mounting accuracy measurement board to measure a mounting accuracy thereof; and
a management computer connected to the control device of each of the multiple component mounting machines,
wherein, when the respective control device switches control modes of two or more component mounting machines, among the multiple component mounting machines, to the mounting accuracy measurement mode, the respective control device instructs that the mounting accuracy measurement board be conveyed between at least the two or more component mounting machines along the board conveyance path and that the two or more component mounting machines sequentially measure the respective mounting accuracy by imaging the mounting accuracy measurement board from above.

2. The mounting accuracy measurement system of the component mounting line of claim 1, wherein when the control mode of a component mounting machine downstream of the two or more component mounting machines is in the production mode, the control device of the component machine of the two or more component mounting machines causes the component mounting machine of the two or more component mounting machines into a standby state without conveying out the mounting accuracy measurement board downstream.

3. The mounting accuracy measurement system of the component mounting line of claim 2, wherein the control device of the component mounting machine of the two or more component mounting machines maintains the stand by state without conveying out the mounting accuracy measurement board even after an end of the mounting accuracy measurement when a current component mounting machine is the most downstream component mounting machine among the multiple component mounting machines.

4. The mounting accuracy measurement system of the component mounting line of claim 2, wherein the control device of each of the multiple component mounting machines guides an operator to take out the mounting accuracy measurement board when the conveyed-in mounting accuracy measurement board is made to stand by.

5. The mounting accuracy measurement system of the component mounting line of claim 1,
wherein each of the multiple component mounting machines comprises a conveyor configured to convey the mounting accuracy measurement board and the circuit board and is configured to change a width of the conveyor in accordance with the width of the mounting accuracy measurement board or the circuit board to be conveyed in,
wherein a component mounting machine in the production mode changes the width of the conveyor in accordance with the width of the circuit board to be conveyed in, while a component mounting machine in the mounting accuracy measurement mode changes the width of the conveyor in accordance with the width of the mounting accuracy measurement board to be conveyed in.

6. The mounting accuracy measurement system of the component mounting line of claim 5,
   wherein each of the multiple component mounting machines is configured to switch to a pass mode in addition to the production mode and the mounting accuracy measurement mode, the pass mode being a mode in which a component is conveyed out without being mounted on a conveyed-in board; and
   wherein the component mounting machine in the mounting accuracy measurement mode conveys out the mounting accuracy measurement board to the component mounting machine on a downstream side after completing the mounting accuracy measurement when the control mode of the component mounting machine on the downstream side is the pass mode.

7. The mounting accuracy measurement system of the component mounting line of claim 6, wherein the component mounting machine in the pass mode changes the width of the conveyor in accordance with the width of the mounting accuracy measurement board when the mounting accuracy measurement board is conveyed in from the component mounting machine on an upstream side.

8. The mounting accuracy measurement system of the component mounting line of claim 6, wherein the component mounting machine in the pass mode conveys out the conveyed-in mounting accuracy measurement board to the component mounting machine on the downstream side when the control mode of the component mounting machine on the downstream side is the mounting accuracy measurement mode.

9. The mounting accuracy measurement system of the component mounting line of claim 6, wherein the component mounting machine in the pass mode causes the conveyed-in mounting accuracy measurement board to stand by without being conveyed out to the component mounting machine on the downstream side when the control mode of the component mounting machine on the downstream side is the production mode.

10. The mounting accuracy measurement system of the component mounting line of claim 6, wherein the component mounting machine in the pass mode causes the conveyed-in mounting accuracy measurement board to stand by without being conveyed out when the component mounting machine is the most downstream component mounting machine among the multiple component mounting machines.

11. The system for measuring mounting accuracy of the component mounting line of claim 1, wherein the management computer is configured to manage production of the component mounting line and the multiple component mounting machines are connected to each other via a network so as to be able to communicate with each other, and each of the multiple component mounting machines acquires information of the control mode of each of the component mounting machines on upstream and downstream sides from the management computer or each of the component mounting machines on the upstream and downstream sides.

12. The mounting accuracy measurement system of the component mounting line of claim 11, wherein each of the multiple component mounting machines acquires information, from the management computer or an upstream component mounting machine, on whether the board to be conveyed in is the mounting accuracy measurement board or the circuit board.

13. The mounting accuracy measurement system of the component mounting line of claim 11,
   wherein the mounting accuracy measurement board is provided with a board information recording portion on which board information on the mounting accuracy measurement board is recorded or stored;
   wherein a board information reading portion configured to read the board information from the board information recording portion of the mounting accuracy measurement board is provided on the most upstream component mounting machine or each of the multiple component mounting machines of the component mounting line is provided; and
   wherein each of the multiple component mounting machines acquires the board information read by the board information reading portion provided on the most upstream component mounting machine of the component mounting line via the network or acquires the board information read by its own board information reading portion.

14. The mounting accuracy measurement system of a component mounting line of claim 11, wherein the management computer designates an upstream component mounting machine among the component mounting machines in the mounting accuracy measurement mode and guides an operator in setting the mounting accuracy measurement board in the upstream component mounting machine.

15. The mounting accuracy measurement system of the component mounting line of claim 11, wherein the management computer designates a component mounting machine which is in a standby state without conveying out the mounting accuracy measurement board and guides an operator to take out the mounting accuracy measurement board from the component mounting machine.

16. The mounting accuracy measurement system of the component mounting line of claim 1, wherein each of the multiple component mounting machines has a function of guiding an operator in setting the mounting accuracy measurement board in the component mounting machine when the component mounting machine is the most upstream component mounting machine among the component mounting machines in the mounting accuracy measurement mode.

17. A mounting accuracy measurement method of a component mounting line including multiple component mounting machines arranged along a board conveyance path for conveying a circuit board and a management computer connected to a control device of each of the multiple component mounting machines, the method comprising:
   controlling the control devices by the management computer to switch between a production mode, in which a component is mounted on the circuit board that is conveyed in and then conveyed out, and a mounting accuracy measurement mode, in which a mounting accuracy measurement component is mounted at a predetermined position on a mounting accuracy measurement board to measure a mounting accuracy thereof; and
   when a control mode of two or more component mounting machines, among the multiple component mounting machines, is the mounting accuracy measurement mode, conveying the mounting accuracy measurement board between at least the two or more component mounting machines along the board conveyance path and sequentially measuring the respective mounting accuracy with the two or more component mounting machines by imaging the mounting accuracy measurement board from above.

* * * * *